(12) United States Patent
Park et al.

(10) Patent No.: US 7,585,684 B2  
(45) Date of Patent: Sep. 8, 2009

(54) METHOD AND APPARATUS FOR DETECTING BACKSIDE PARTICLES DURING WAFER PROCESSING

(75) Inventors: Seung-Bae Park, Seoul (KR); Jae-Sung Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 430 days.

(21) Appl. No.: 11/341,835

(22) Filed: Jan. 26, 2006

(65) Prior Publication Data

US 2006/0171095 A1   Aug. 3, 2006

(30) Foreign Application Priority Data

Feb. 1, 2005   (KR) .................... 10-2005-0009253

(51) Int. Cl.  
    *H01L 21/66* (2006.01)
(52) U.S. Cl. ........................................ 438/14
(58) Field of Classification Search .............. None  
    See application file for complete search history.

(56) References Cited

U.S. PATENT DOCUMENTS

| | | | |
|---|---|---|---|
| 4,737,824 A | 4/1988 | Sakai et al. | |
| 5,815,762 A | 9/1998 | Sakai et al. | |
| 5,963,315 A | 10/1999 | Hiatt et al. | |
| 6,204,917 B1 | 3/2001 | Smedt | |
| 6,327,021 B1* | 12/2001 | Higashiguchi | 355/30 |
| 6,733,594 B2 | 5/2004 | Nguyen | |
| 7,159,599 B2* | 1/2007 | Verhaverbeke et al. | 134/109 |
| 2003/0045098 A1* | 3/2003 | Verhaverbeke et al. | 438/689 |
| 2003/0045131 A1* | 3/2003 | Verbeke et al. | 438/795 |

FOREIGN PATENT DOCUMENTS

| | | |
|---|---|---|
| JP | 11-087480 | 3/1999 |
| JP | 2002-246453 | 8/2002 |
| JP | 2003-045947 A | 2/2003 |
| JP | 2004-200329 | 7/2004 |
| KR | 1999-0023285 | 7/1999 |
| KR | 2002-0096086 | 12/2002 |
| KR | 2004-0008894 | 1/2004 |

OTHER PUBLICATIONS

English language abstract of Korean Publication No. 2002-0096086.  
English language abstract of Japan Publication No. 2004-200329.

* cited by examiner

*Primary Examiner*—Charles D. Garber  
*Assistant Examiner*—Andre' C Stevenson  
(74) *Attorney, Agent, or Firm*—Marger Johnson & McCollom, P.C.

(57) ABSTRACT

A method and apparatus for detecting backside particles during wafer processing is provided. The method includes forming layers on a front side of a wafer, holding a backside of the wafer on a top surface of a chuck, cooling the wafer by ejecting gas toward the backside of the wafer and detecting the presence of particles on the backside of the wafer whiles ejecting the gas toward the backside of the wafer. The presence of particles is detected if the pressure of the ejected gas is outside of a predetermined range.

17 Claims, 4 Drawing Sheets

METHOD AND APPARATUS FOR DETECTING BACKSIDE PARTICLES DURING WAFER PROCESSING

CROSS-REFERENCE TO RELATED APPLICATION

This application claims the benefit under 35 U.S.C. § 119 of Korean Patent Application No. 10-2005-0009253, filed on Feb. 1, 2005, the entire disclosure of which is hereby incorporated by reference.

TECHNICAL FIELD

This disclosure relates to processing substrates used in fabricating semiconductor devices or flat panel display devices and, more particularly, to a method and apparatus for detecting backside particles during wafer processing.

BACKGROUND

As the integration density of semiconductor devices continues to increase, various research aimed at improving the productivity of semiconductor devices continues to progress. To improve the productivity of the semiconductor device, the semiconductor device should have no defects. Defects may occur at various stages of semiconductor device fabrication. Defects on the backside of a wafer may especially linger and affect subsequent processing steps.

Defects on the backside of the wafer result mainly from accumulation of unwanted particles. The particles may be dust, polymer deposits, and/or excess photo-resist accumulated during prior processing steps or wafer transfer. Such accumulation of unwanted particles may cause problems during subsequent processing steps. For example, a photoresist may cling to the backside of the wafer while a photoresist layer is forming on a front side of the wafer. The photoresist on the backside of the wafer adversely affects focusing in a subsequent lithography process and leads to a malformed pattern. This may be a major cause of defects in semiconductor devices.

In addition, in a process of forming a thin film on the front side of the wafer by chemical vapor deposition (CVD) or sputtering, backside particles prevent the wafer from sitting properly on a chuck. In such a case, the process should be suspended, which results in considerable downtime. Accordingly, backside particles deteriorate productivity and run up manufacturing costs.

An apparatus for detecting backside particles is disclosed in U.S. Pat. No. 5,963,315 entitled "Method and Apparatus for Processing a Semiconductor Wafer On a Robotic Track Having Access To In Situ Wafer Backside Particle Detection" by Hiatt, et al. According to Hiatt, et al., a laser source and a detector are mounted on a robotic arm, or within a semiconductor processing tool. While the wafer is transferred by the robotic arm, its backside is scanned by a laser beam to detect particles.

Another apparatus for detecting backside particles is disclosed in U.S. Pat. No. 6,204,917 entitled "Backside Contamination Inspection Device" by Smedt, et al. According to Smedt, et al., the semiconductor wafer is rotated to an inclined state. The wafer is supported by roller bearings and its backside is scanned by a scan head to detect particles. The scan head includes a laser illuminator and a CCD sensor and moves in close proximity to the surface being scanned to detect particles.

Generally, a laser source and a coupled sensor are used to detect backside particles. The laser source emits a laser beam onto a predetermined area of the backside of the wafer and the sensor receives a reflected beam. When particles exist on the backside of the wafer, the incident angle of the reflected beam upon the sensor varies. Backside particles can be detected by measuring the incident angle of the reflected beam. However, the laser source and the sensor should be separately mounted, thereby complicating the apparatus. Also, considerable time is required to scan the whole surface of the wafer by using the laser beam, thus delaying the overall wafer process.

SUMMARY

A method of processing wafers includes forming layers on a front side of a wafer, holding a backside of the wafer on a top surface of a chuck, cooling the wafer by ejecting gas from the chuck toward the backside of the wafer and detecting the presence of a particle on the backside of the wafer while ejecting the gas from the chuck toward the backside of the wafer. The chuck may be an electrostatic chuck.

A wafer processing apparatus includes a transfer chamber, a load lock chamber connected to the transfer chamber to temporarily store a wafer, a process chamber connected to the transfer chamber to form a layer on a front side of the wafer and a cooling chamber connected to the transfer chamber to cool the wafer. The cooling chamber includes a chuck to hold the wafer and the chuck includes a nozzle to eject a gas toward a backside of the wafer. The nozzle may be connected to a gas supply through a gas line and a pressure sensor may be connected to the gas line.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE INVENTION

Figure 1:
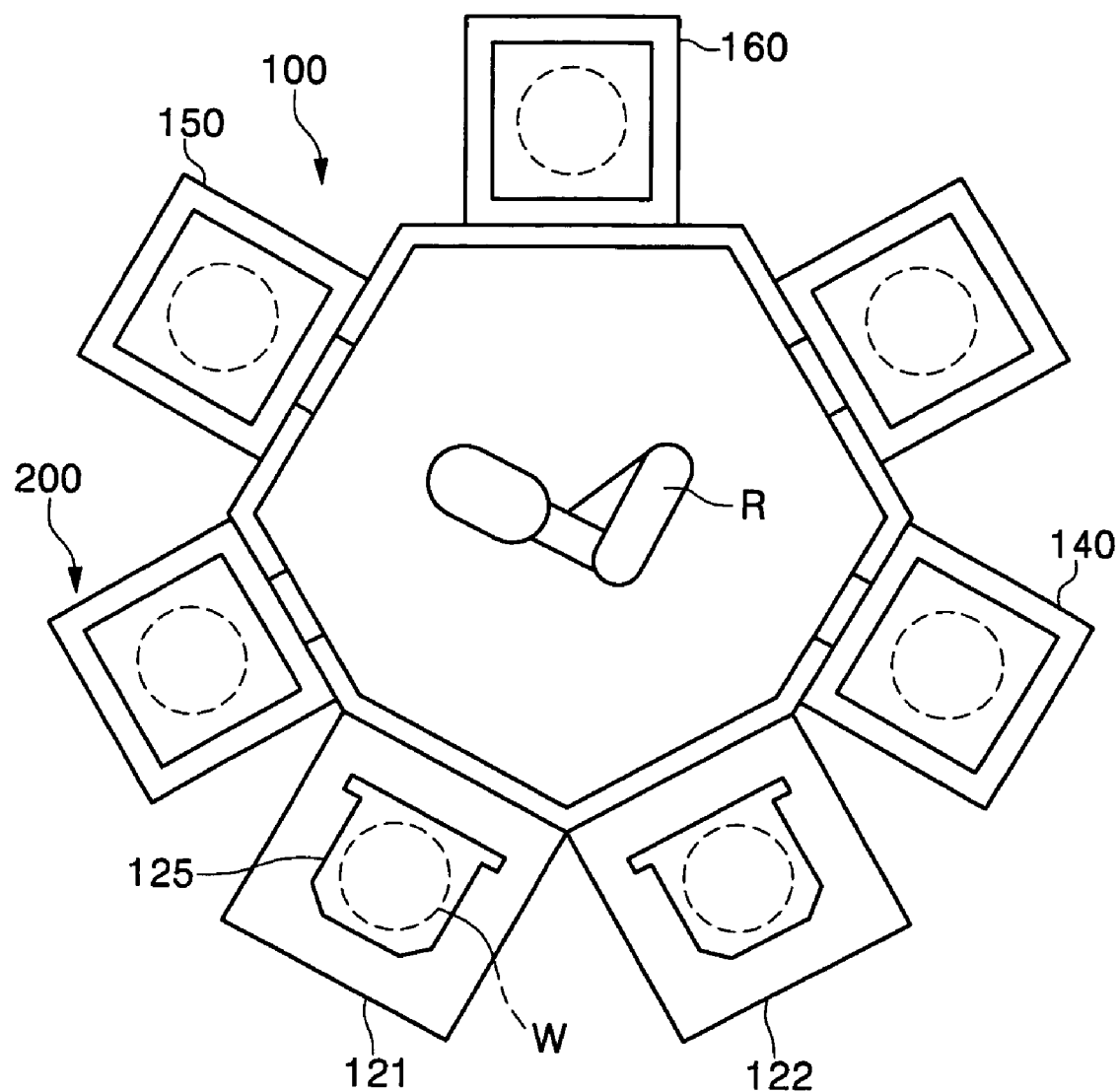
FIG. 1 is a schematic diagram showing an apparatus for processing wafers in accordance with an embodiment of the present invention.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

FIG. 1 is a schematic diagram showing an apparatus 100 for processing wafers. Referring to FIG. 1, the apparatus for processing wafers 100 includes a transfer chamber 110, a first load lock chamber 121, a second load lock chamber 122, a process chamber 160 and a cooling chamber 200.

The transfer chamber 110 transfers a wafer W between the first load lock chamber 121, the second load lock chamber 122, the process chamber 160 and the cooling chamber 200. A robot R is disposed in the transfer chamber 110 to transfer the wafer W. The robot R may transfer the wafer W from the first load lock chamber 121 to the process chamber 160, from the process chamber 160 to the cooling chamber 200 and from the cooling chamber 200 to the second load lock chamber 122. Also, the robot R may transfer the wafer W between process chambers 160. The transfer chamber 110 and the robot R are generally well known in the art.

The wafer W may include various kinds of substrates, on which layers are formed by etching, deposition or patterning, as well as semiconductor wafers. The backside of the wafer means the opposite of a front side of the wafer on which specific layers are formed by etching, deposition, etc., or some pattern is formed.

The first load lock chamber 121 and the second load lock chamber 122 are connected to the transfer chamber 110. The first load lock chamber 121 provides a space for temporarily storing the wafers W to be loaded into the transfer chamber 110. The second load lock chamber 122 offers a space for temporarily storing the wafers W unloaded from the transfer chamber 110. The first load lock chamber 121 may correspond to an input load lock chamber and the second load lock chamber 122 may correspond to an output load lock chamber. Alternatively, one load lock chamber may be used as both an input load lock chamber and an output load lock chamber. Load lock chambers are generally well known in the art.

The process chamber 160 for performing a predetermined processing on the front side of the wafer W is disposed on the transfer chamber 110. The process may include etching, deposition or some form of patterning which forms layers on the front side of the wafer W at a temperature of over 100° C. For example, the process chamber may be a sputter, a spinner, a CVD, etc.

A wafer cleaning chamber 150 may be mounted on the transfer chamber 110. When backside particles P are detected by the cooling chamber 200, described in detail hereinafter, the contaminated wafer W may be removed to the second load lock chamber 122 through the transfer chamber 110. However, it requires considerable time to clean the removed wafer W and load it into the first load lock chamber 121 again, thus resulting in process delay. Accordingly, the cleaning chamber 150 mounted on the transfer chamber 110 can clean the contaminated wafer W readily within the apparatus for processing wafers 100.

When particles are detected on the backside of the wafer W in the cooling chamber 200, the contaminated wafer W is transferred into the cleaning chamber 150 via the transfer chamber 110. The cleaning chamber 150 cleans the contaminated wafer W by a dry cleaning process, a semi-dry cleaning process, a wet cleaning process, etc. The cleaning chamber 150 is generally well known in the art.

An aligner 140 may be also connected to the transfer chamber 110. The aligner 140 aligns the wafer W coarsely. To align the wafer W, the wafer W is moved horizontally or rotated by recognizing a notch or a flat zone of the wafer W.

The cooling chamber 200 is mounted on the transfer chamber 110. The cooling chamber 200 cools the wafer W heated in the process chamber 160 to a predetermined normal temperature and detects the presence of particles.

Figure 2:
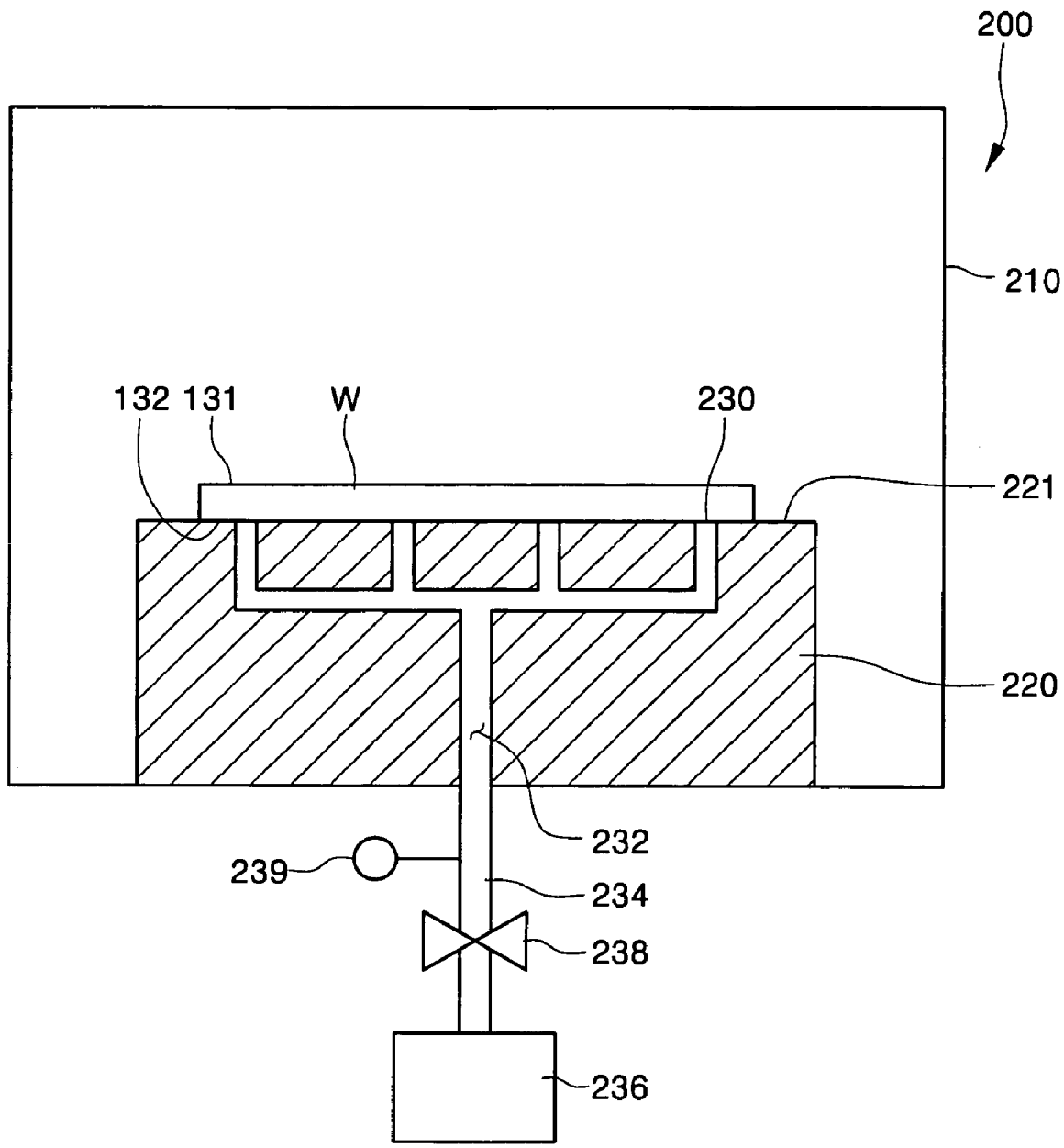
FIG. 2 is an enlarged view of a cooling chamber of FIG. 1.

FIG. 2 is an enlarged view of the cooling chamber 200. Referring to FIG. 2, the cooling chamber 200 includes a chamber wall 210 for providing an airtight space, a chuck 220 mounted inside the chamber wall 210 to hold the wafer W, and a nozzle 230 for ejecting gas to the backside of the wafer W.

The chamber wall 210 keeps the cooling chamber 200 airtight. An exhaust pipe (not shown) may be provided in the chamber wall 210 to exhaust the gas.

The chuck 220 holds the backside of the wafer W in contact with a top surface 221 thereof. To ensure a stable contact of the wafer W, an electrostatic chuck 220 may be applied. However the present general inventive concept is not limited to this configuration and vacuum chuck or mechanical chuck may be applied, if necessary.

The electrostatic chuck 220 holds the wafer W by generating electrostatic force between the wafer W and the chuck 220. When voltage is applied to at least one electrode (not shown), electric charges having an opposite polarity, respectively, to the wafer W and the electrode are induced. The opposite electric charges lead the chuck 220 to hold the wafer.

The nozzle 230 for ejecting gas toward the backside 132 of the wafer W is installed in the chuck 220. A gas supply hole 232 is formed inside the chuck 220 connected to the nozzle 230. The gas supply hole 232 is connected with a gas line 234 coupled with a gas supplier 246. A gas valve 238 is installed in the gas line 234 to interrupt the gas supply when there is no wafer W. Also, a pressure sensor 239 for measuring the gas pressure is connected to the gas line 234. When the gas valve 238 is opened, the gas is ejected via the nozzle 230 and the pressure sensor 239 measures the gas pressure.

The chuck 220 may include support pins (not shown) on which the wafer W is temporarily loaded by the robot R of the transfer chamber 110. When the robot R positions the wafer W on the top of the chuck 220 to load the wafer W into the cooling chamber 200, the support pins move upward. Then, the robot R lowers the wafer W onto ends of the support pins and leaves the cooling chamber 200.

When the voltage is applied to the chuck 220, the wafer W is held. Then, the gas is ejected toward the backside 132 of the wafer W via the nozzle 230 by opening the gas valve 238. Since the gas is at a predetermined normal temperature, the gas acts a cooling media to cool the wafer W at the predetermined normal temperature.

The gas should not react with various layers, such as insulating layer, etc., formed on the front side 131 of the wafer W. Therefore, it is preferable to use inert gas, such as He gas, $N_2$ gas or Ar gas.

To raise the cooling efficiency, a thermoelectric element (not shown) may be further installed inside the chuck 220. A circulation conduit for circulating a cooling media such as deionized water may also be provided inside the chuck 220.

Figure 3:
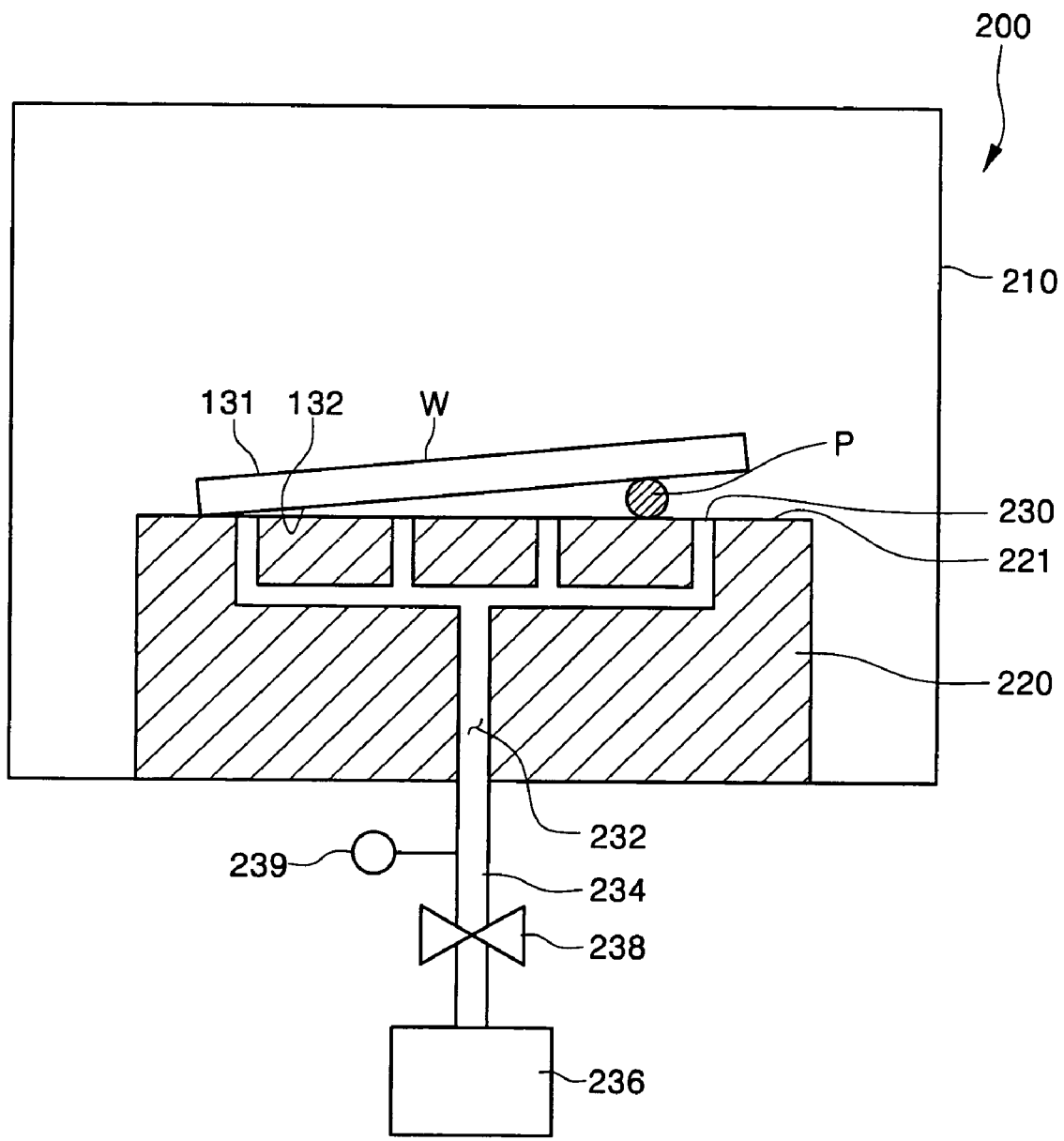
FIG. 3 shows a wafer which is displaced due to a particle in the cooling chamber of FIG. 2.

FIG. 3 shows the wafer W which is displaced due to a particle P in the cooling chamber of FIG. 2.

When particles P exist on the backside 132 of the wafer W, the backside 132 does not closely contact the top surface 221 of the chuck 220. The particles P may be by-products generated during previous processes, deposits such as remnants of patterned material, or dust collected during wafer transfer. The particles P may stick to the backside 132 of the wafer W via static electricity, etc.

When the wafer W is displaced due particles P, the gas may leak and the gas pressure decreases. The pressure sensor 239 measures the pressure of the gas. If the measured pressure of the gas is lower than a predetermined range, gas is leaking, and it is concluded that particles P exist on the backside 132 of the wafer W.

The cooling chamber 200 ejects the gas toward the backside 132 of the wafer W to cool the wafer W and, at the same time, detects the existence of the particles P. Accordingly, a separate process for detecting particles P is unnecessary, thus reducing the time for processing.

While the apparatus for processing wafers 100 is described above as including two load lock chambers, two process chambers, one cleaning chamber and one cooling chamber, the present general inventive concept is not limited to this configuration. The apparatus for processing wafers 100 may include a larger or a smaller number of each element. For example, the apparatus for processing wafers 100 may have five process chambers and two cooling chambers.

A method for processing will now be described with reference to FIGS. 1, 2 and 4.

Figure 4:
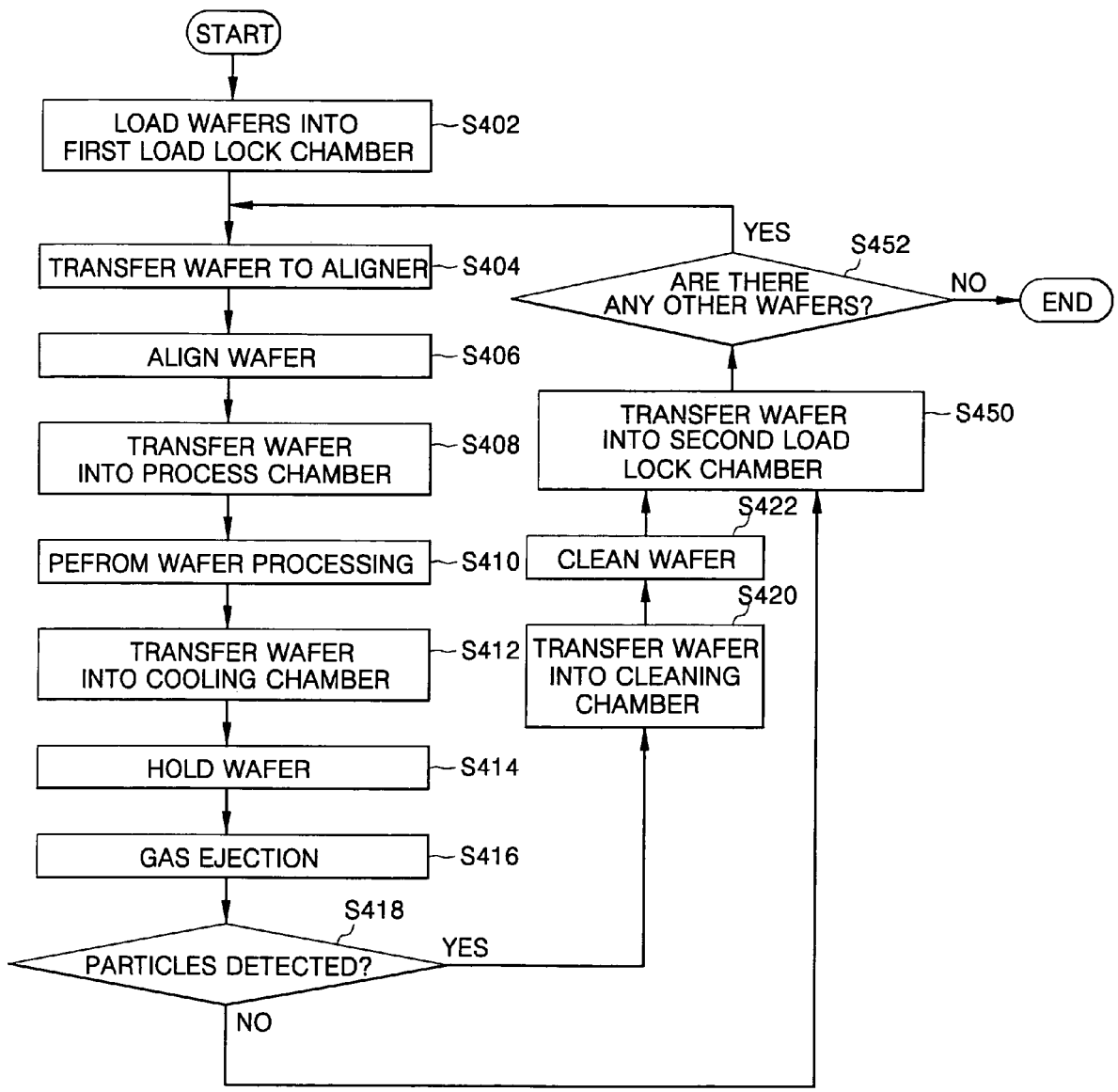
FIG. 4 is a flowchart illustrating a method for processing wafers in accordance with another embodiment.

FIG. 4 is a flowchart illustrating a method for processing wafers. Referring to FIG. 4, a cassette 125 having a plurality of wafers is loaded into the first load lock chamber 121 [S402]. The robot R in the transfer chamber 110 transfers the wafer W from the first load lock chamber 121 into the aligner 140 [S404]. Then, the aligner 140 aligns the wafer W by recognizing the notch or flat zone of the wafer W [S406].

Subsequently, the robot R transfers the wafer W into the process chamber 160 [S408]. In the process chamber 160, the wafer processing is performed [S410].

The processed wafer W is transferred to the cooling chamber 220 [S412]. When the wafer W is positioned on the top surface 221 of the chuck 220, the wafer W is held by the chuck 220 [S414]. In the case of an electrostatic chuck 220, voltage is applied to the electrode(s).

Gas at a predetermined normal temperature is ejected toward the backside 132 of the wafer via the nozzle 230 by opening the gas valve 238 [S416]. The gas may be He gas, $N_2$ gas or Ar gas. The gas acts a cooling media to cool the wafer W to the predetermined normal temperature. At the same time, the pressure sensor 239 measures the gas pressure [S418]. If particles P exist on the backside 132 of the wafer W, the gas leaks. When the gas pressure is lower than a predetermined value due to the gas leakage, it is concluded that particles P exist on the backside 132 of the wafer W.

If particles P are detected, the robot R transfers the wafer W to the cleaning chamber 160 [S420]. Then, the contaminated wafer W is cleaned in the cleaning chamber 150 [S422]. After finishing the wafer W cleaning, the robot R transfers the wafer W to the second load lock chamber 122.

If no particles P are detected, the robot R transfers the wafer W to the second load lock chamber 122 [S450].

If there is another wafer W waiting to be processed, the robot R moves to the first load lock chamber 121 and repeats ST 404 [S452].

After performing the wafer processing, the cooling chamber 200 cools the wafer W and, at the same time, detects the particles P. If particles P are detected, the wafer W is cleaned to remove the particles P and subsequent processing steps are performed. Accordingly, it is possible to prevent the wafer contamination caused by the particles and reduce downtime caused by the particles in the following processing steps. Consequently, it is possible to perform reliable wafer processing without loss in productivity.

While this general inventive concept has been described in terms of several preferred embodiments, there are alternations, permutations, and equivalents, which fall within the scope of this invention. It should also be noted that there are many alternative ways of implementing the methods and apparatuses of the present general inventive concept. It is therefore intended that the following appended claims be interpreted as including all such alternations, permutations, and equivalents as fall within the true spirit and scope of the present disclosure.

The invention claimed is:

1. A method of processing wafers comprising:
    forming layers on a front side of a wafer;
    holding a backside of the wafer on a top surface of a chuck;
    cooling the wafer by ejecting gas toward the backside of the wafer; and
    detecting the presence of a particle on the backside of the wafer while ejecting the gas from the chuck toward the backside of the wafer.

2. The method of claim 1, wherein holding a backside of the wafer on a top surface of a chuck includes holding a backside of the wafer on a top surface of a chuck located inside of a cooling chamber.

3. The method of claim 1, wherein detecting the presence of a particle on the backside of the wafer includes measuring a variation of a pressure of the ejected gas.

4. The method of claim 1, wherein the ejected gas is selected from the group consisting of helium, nitrogen, argon and combinations thereof.

5. The method of claim 1, wherein holding a backside of the wafer on a top surface of a chuck includes holding a backside of a wafer on a top surface of an electrostatic chuck.

6. The method of claim 1, further comprising cleaning the wafer if a particle is detected.

7. A method of processing wafers comprising:
    loading a wafer into a transfer chamber;
    transferring the wafer into a process chamber connected to the transfer chamber;
    forming a layer on a front side of the wafer at a first temperature in the process chamber;
    transferring the wafer into a cooling chamber connected to the transfer chamber;
    holding the wafer on the chuck in the cooling chamber;
    cooling the wafer to a second temperature lower than the first temperature by ejecting gas to a backside of the wafer; and
    detecting the presence of a particle on the backside of the wafer while ejecting the gas toward the backside of the wafer.

8. The method of claim 7, wherein detecting the presence of a particle on the backside of the wafer includes measuring a variation in a pressure of the ejected gas.

9. The method of claim 8, further comprising determining a particle is present on the backside of the wafer when the measured variation in the pressure of the ejected gas is outside of a predetermined range.

10. The method of claim 8, wherein the ejected gas is selected from the group consisting of helium, nitrogen, argon and combinations thereof.

11. The method of claim 7, further comprising cleaning the wafer if a particle is detected on the backside of the wafer.

12. The method of claim 7, wherein the first temperature is over 100° C.

13. The method of claim 7, wherein holding the wafer on a chuck in the cooling chamber includes holding the wafer on an electrostatic chuck in the cooling chamber.

14. A method of detecting a particle on a backside of a wafer comprising:
    holding the wafer on a chuck;
    cooling the wafer by ejecting a gas toward the backside of the wafer; and
    detecting the presence of a particle on the backside of the wafer by measuring a variation of a pressure of the ejected gas.

15. The method of claim 14, further comprising determining a particle is present on the backside of the wafer when the measured variation of the pressure of the ejected gas is outside of a predetermined range.

16. The method of claim 14, wherein the ejected gas is selected from the group consisting of helium, nitrogen, argon and combinations thereof.

17. The method of claim 14, wherein holding the wafer on a chuck includes holding the wafer on an electrostatic chuck.

* * * * *